United States Patent
Slupsky

(10) Patent No.: US 6,885,202 B2
(45) Date of Patent: Apr. 26, 2005

(54) NON-CONTACT TESTER FOR ELECTRONIC CIRCUITS

(75) Inventor: Steven Harold Slupsky, Edmonton (CA)

(73) Assignee: Scanimetrics Inc., Edmonton (CA)

( * ) Notice: Subject to any disclaimer, the term of this patent is extended or adjusted under 35 U.S.C. 154(b) by 0 days.

(21) Appl. No.: 10/666,553

(22) Filed: Sep. 19, 2003

(65) Prior Publication Data

US 2004/0075453 A1 Apr. 22, 2004

(30) Foreign Application Priority Data

Sep. 19, 2002 (CA) ............................................ 2404183

(51) Int. Cl.⁷ ............................................ G01R 31/308
(52) U.S. Cl. .................... 324/753; 324/765; 324/158.1
(58) Field of Search ................. 324/765, 752, 324/751, 753, 158.1, 763, 755, 96; 714/733, 719, 724; 257/723, 48; 438/14–19; 359/237, 245, 246, 247, 256, 257, 258

(56) References Cited

U.S. PATENT DOCUMENTS

| | | | |
|---|---|---|---|
| 5,764,655 A | * | 6/1998 | Kirihata et al. ............. 714/733 |
| 6,161,205 A | * | 12/2000 | Tuttle ......................... 714/724 |
| 6,331,782 B1 | * | 12/2001 | White et al. ................. 324/763 |
| 6,412,086 B1 | * | 6/2002 | Friedman et al. ........... 714/733 |
| 6,449,308 B1 | | 9/2002 | Knight, Jr. et al. ......... 375/212 |
| 6,525,566 B1 | | 2/2003 | Haigh et al. .................. 326/82 |
| 6,573,801 B1 | | 6/2003 | Benham et al. ........... 333/24 R |
| 6,625,682 B1 | | 9/2003 | Simon et al. ............... 710/305 |
| 2002/0186106 A1 | | 12/2002 | Miller | |
| 2004/0004216 A1 | | 1/2004 | Eldridge et al. | |

* cited by examiner

Primary Examiner—David Zarneke
Assistant Examiner—Jimmy Nguyen
(74) Attorney, Agent, or Firm—Davis & Bujold, P.L.L.C.

(57) ABSTRACT

A non-contact tester for electronic circuits consists of an electronic circuit and independent scanning head, in combination. The electronic circuit includes a micro-fabricated wireless i/o cell and means for sending and receiving signals via the wireless i/o cell. The independent scanning head has a wireless i/o cell that is compatible with the wireless i/o cell on the electronic circuit. This enables data to be exchanged with the electronic circuit to confirm proper functioning of the electronic circuit.

7 Claims, 3 Drawing Sheets

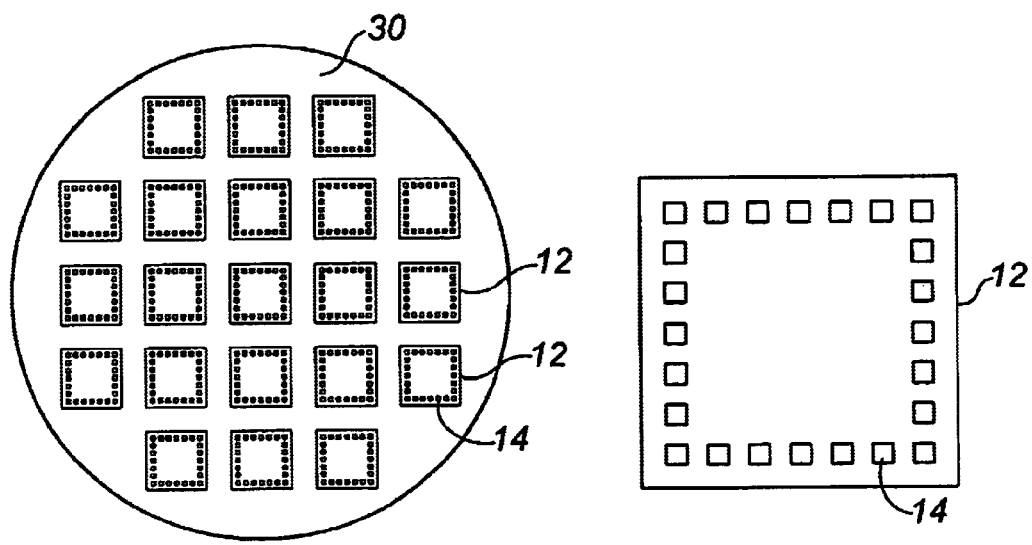
FIG. 4
FIG. 3
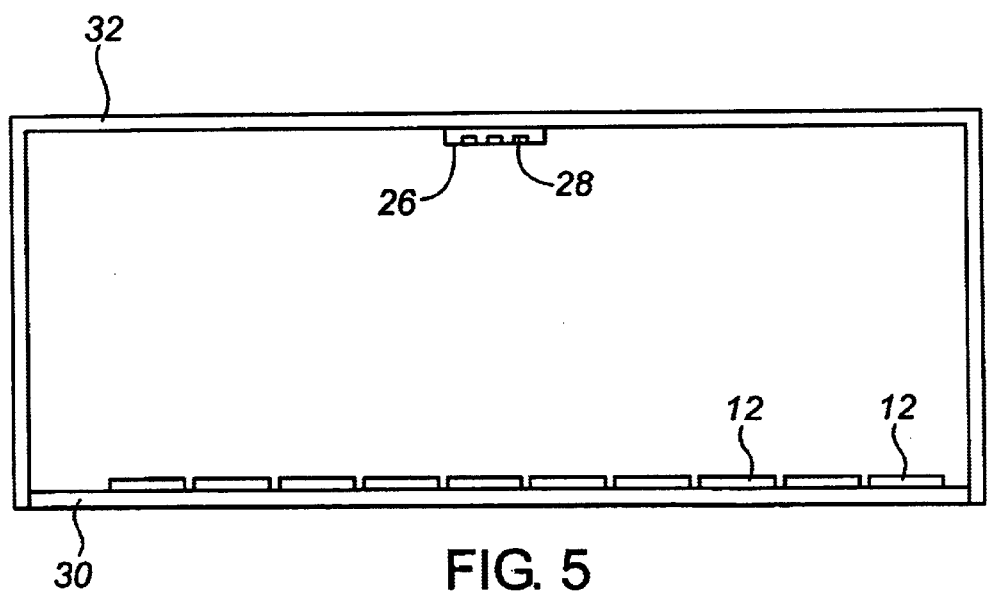
FIG. 5

NON-CONTACT TESTER FOR ELECTRONIC CIRCUITS

FIELD OF THE INVENTION

The present invention relates to testers for electronic circuits.

BACKGROUND OF THE INVENTION

Electronic circuits must be tested to ensure that they are not defective. At the present time this is done through the use of mechanical probes. The mechanical probes touch down on the electronic circuit and data is passed through the circuit. However, in making contact with the electronic circuit damages sometimes occurs when the mechanical probes make physical contact.

SUMMARY OF THE INVENTION

What is required is a tester for electronic circuits which is able to test the electronic circuits without making physical contact.

According to the present invention there is provided a non-contact tester for electronic circuits which consists of an electronic circuit and independent scanning head, in combination. The electronic circuit includes a micro-fabricated wireless i/o cell and means for sending and receiving signals via the wireless contact. The independent scanning head has a wireless i/o cell compatible with the wireless i/o cell on the electronic circuit. This enables data to be exchanged with the electronic circuit to confirm proper functioning of the electronic circuit.

BRIEF DESCRIPTION OF THE DRAWINGS

These and other features of the invention will become more apparent from the following description in which reference is made to the appended drawings, the drawings are for the purpose of illustration only and are not intended to in any way limit the scope of the invention to the particular embodiment or embodiments shown, wherein:

FIG. 3 is a top plan view of a electronic circuit having a plurality of i/o cells.

FIG. 4 is an top plan view of a wafer having with a plurality of electronic circuits.

FIG. 5, is a side elevation view of the non-contact tester constructed in accordance with the teachings of the invention.

DETAILED DESCRIPTION OF THE PREFERRED EMBODIMENT

The preferred embodiment, a non-contact tester for electronic circuits will now be described with reference to FIGS. 1 through 5.

Figure 1:
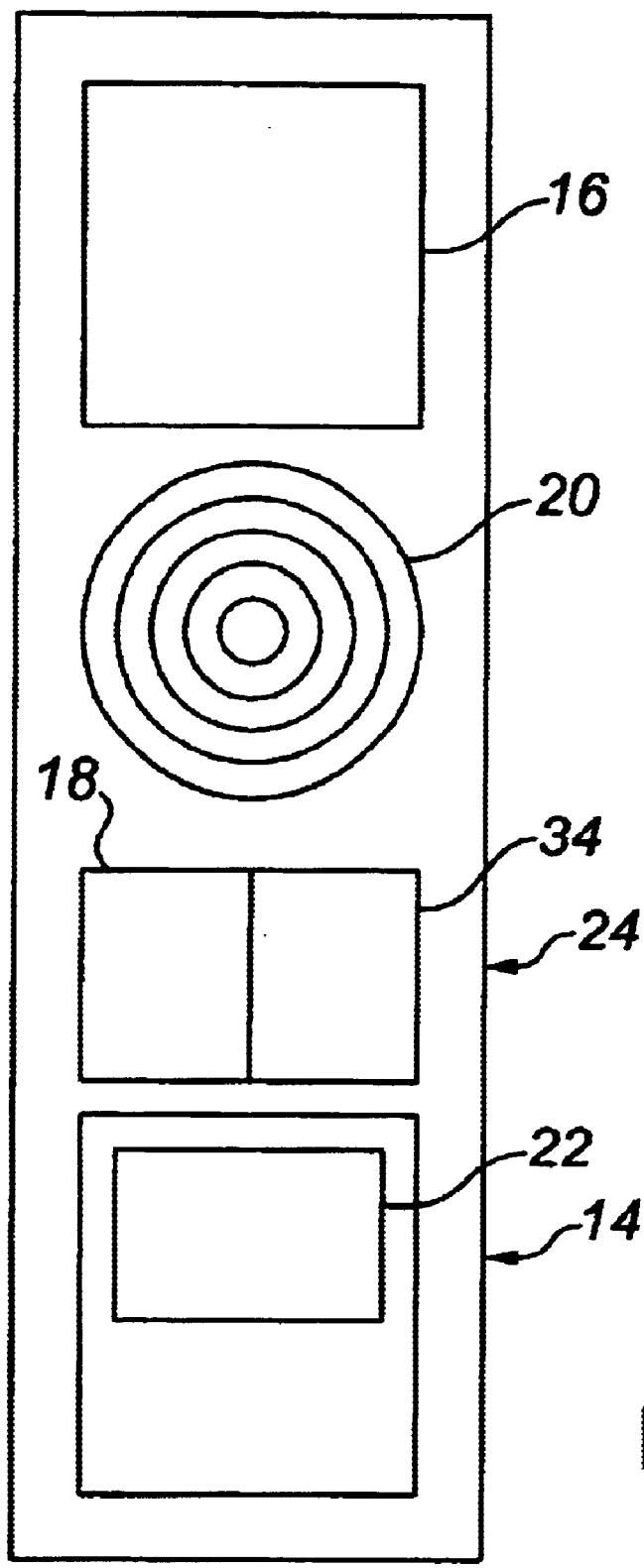
FIG. 1 is a top plan view of an i/o cell.
Figure 2:
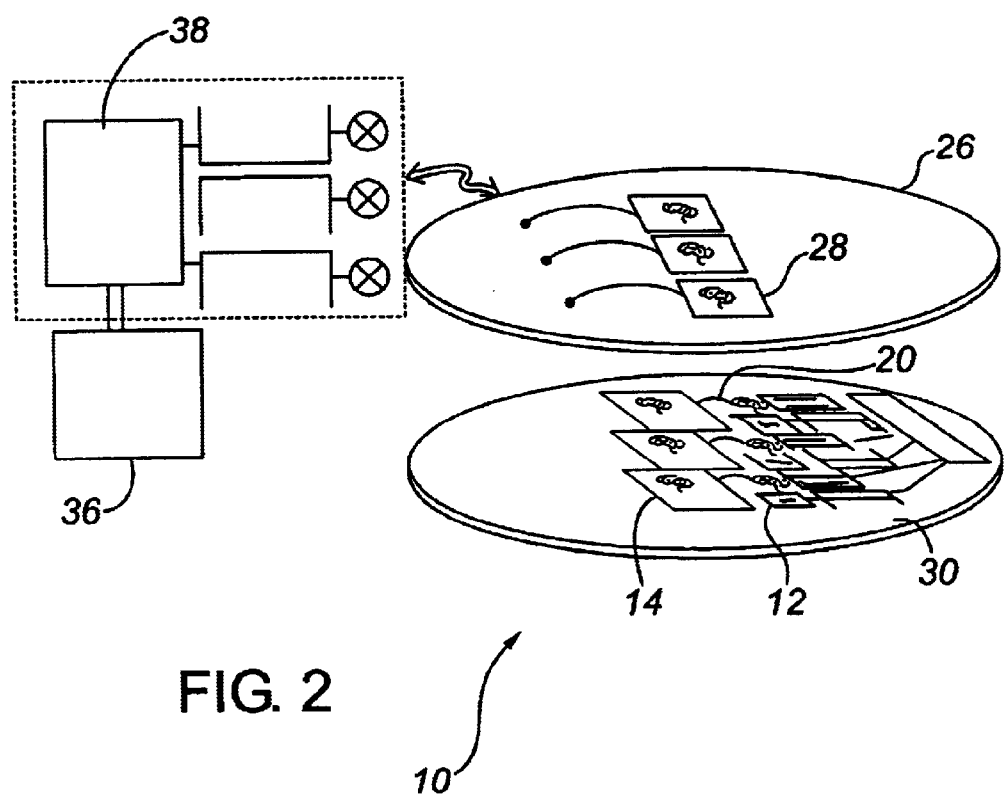
FIG. 2 is a representation of an independent scanning head scanning a series of electronic circuits in accordance with the teachings of the present invention.

Referring to FIG. 2, there is provided a non-contact tester for electronic circuits, generally referenced by numeral 10. Non-contact tester 10 includes an electronic circuit 12 illustrated in FIG. 3 which has a wireless i/o cell 14. Referring to FIG. 1, in the illustrated embodiment, i/o cell 14 includes a bond pad 16, a transceiver 18, an antenna 20 and input/output elements 22, however, it will be appreciated that i/o cell 14 could work without a bond pad 16, or that antenna 20 could also function as a bond pad. Referring to FIG. 2, electronic circuit 12 also has a radio frequency interface generally referenced by numeral 24 for sending and receiving signals via wireless i/o cell 14 illustrated in FIG. 1.

Referring to FIG. 5, an independent scanning head generally referenced by numeral 26 is also provided. Independent scanning head 26 has wireless i/o cells 28 that are compatible with wireless i/o cells 14 on electronic circuit 12 illustrated in FIG. 3, such that data may be exchanged confirm proper functioning of electronic circuit 12. Referring to FIG. 5 in the illustrated embodiment, independent scanning head 26 is scanning a semiconductor wafer 30 with a plurality of electronic circuits 12 patterned on it as illustrated in FIG. 4. In the illustrated embodiment, scanning head 26 is supported and moveable along a supporting framework 32 so that scanning head 26 can move over the surface of semiconductor wafer 30, however it will be appreciated that there are other forms of supporting and moving scanning head 26.

A different circuit is provided for each wireless i/o cell 14 illustrated in FIG. 3, to be tested by non-contact tester 10. Referring to FIGS. 3 and 4, wireless i/o cells 28 have a plurality of contact points which are adapted to correspond on a one to one relationship with a plurality of contact points provided on wireless i/o cell 14 of electronic circuit 12 that is being tested.

Referring to FIG. 1, electronic circuit 12 uses radio frequency interface 16 which includes a transmitter 18 and a receiver 34, however it will be appreciated that in the alternative, non-contact tester 10 could also use an optical or a magnetic interface for sending and receiving signals. Where an optical interface is used, the optical interface will include at least one light emitter and at least one light receptor. Where a magnetic interface is used, the magnetic interface will include at least on magnetic generator and one magnetic detector.

The use and operation of non-contact tester will be now be described with reference to FIGS. 1 through 5. To test circuits in a non-contact manner, non-contact tester 10 is provided as described above. Referring to FIG. 5, wafer 30 with is positioned below independent scanning head. Scanning head 26 is supported by and moves along supporting framework 32 so that scanning head 26 can move over the surface of semiconductor wafer 30, to test electronic circuits 12 on wafer 30.

Independent scanning head 26 is has wireless i/o cells 28 compatible with wireless i/o cells 14 on electronic circuit 12, such that data may be exchanged with electronic circuit 12. Finally, electronic circuit 12 is tested by exchanging data with independent scanning head 26 to confirm proper functioning of electric circuit 12. Referring to FIG. 2, a computer 36 with a Ghz vector processor 38 is provided for controlling independent scanning head 18 and for collection of data.

Additional Information:

Non-contact tester is comprised of a silicon substrate and a plurality of microfabricated antennae structures. Each antenna is located within the silicon substrate in a manner such that when the scanning antenna is aligned with the DUT (Device Under Testing) on a wafer, each antenna is coincident in 2 dimensions to a reciprocal antenna structure located on the DUT.

Power is coupled to the wafer by way of microfabricated MEMS cantilever test probes. Alternatively, power may be coupled using RF (radio frequency) energy by way of microfabricated antennae structures patterned on the same substrate as the Virtual Probe structures. Alternatively, power may be coupled magnetically using microfabricated inductors or transformers. Alternatively, power may be coupled optically by way of incident laser energy on a microfabricated structure on the DUT.

The non-contact tester comprises of a microfabricated scanning antenna, a printed circuit board and a plurality of electronic circuits.

Frequency discrimination between adjacent pads is by way of different oscillating frequencies. This is accomplished using ring oscillator chains of different length.

Antenna size and structure on the wafer is matched to the ring oscillator frequency.

The scanning circuits located in the scanning head "auto tune" to the carrier frequency of the test circuit transmitter located on the wafer. Encoded data is received and decoded from the carrier signal.

A simple rectifier circuit is used to decode the signal transmitted from the scanning head to the wafer.

Test vectors may be generated "on chip" using BIST (Built-In Self Test) techniques. Alternatively, test vectors may be generated using a memory element and logic sequencer.

Test vectors may be generated externally and coupled to the DUT using the scanning head. Test vectors may be applied to individual i/o pads in this way.

The present invention comprises a test circuit for testing an electronic circuit on a wafer during wafer test (Functional test). The present invention comprises a test circuit for testing an electronic circuit on a wafer during wafer fabrication (Process Control Monitoring).

Antenna structures are approximately the same size as standard i/o cells.

Optionally, optical methods may be used to interface to the electronic circuit. High speed CMOS image sensors and high speed PIN diodes.

Optionally, magnetic methods may be used to interface to the electronic circuit. High speed Giant Magneto Resistive Thin Film heads and high speed magnetic coils.

This technology allows for testing electronic circuits during the IC fabrication process using wireless RF telemetry. The technology adds to or replaces existing bonding pads in an electronic circuit with an RF transceiver device. This device can act as a bonding pad during manufacture and test of an electronic circuit and communicates information in a wireless manner. Using this virtual Test Probe, semiconductor manufacturers can stop the trend of growing test costs with respect to transistor fabrication cost while at the same time improving test performance in areas that are causing very serious problems.

Additional Benefits:

The solution saves money in several ways at the same time;

1. Non-contact testers are significantly less expensive than current mechanical probe cards.
2. Non-contact testers eliminate i/o bond pad damage during touch downs.
3. Mechanical contact testers such as probes cards "wear out" due to mechanical failure. Non-contact testers do not suffer from mechanical wear and therefore require less cleaning and maintenance.
4. Non-contact testers offer unique prototype test capabilities not available with conventional test methods such as internal test points.
5. Non-contact testers can test to smaller geometries and at higher speeds, thereby postponing expensive test equipment upgrades.
6. Non-contact tester technology provides improved test coverage by allowing the electronic circuit to be tested "at speed".

in this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

It will be apparent to one skilled in the art that modifications may be made to the illustrated embodiment without departing from the spirit and scope of the invention as hereinafter defined in the claims.

The embodiments of the invention in which an exclusive property or privilege is claimed are defined as follows:

1. A non-contact tester for electronic circuits, comprising in combination:
   an electronic circuit which includes a plurality of wireless i/o cells and means for sending and receiving signals via each of the at least one wireless i/o cells, and a wireless i/o cell being provided for each contact point on the electronic circuit to be tested; and
   an independent scanning head having a plurality of wireless i/o cells compatible with the wireless i/o cells on the electronic circuit, such that data may be exchanged with the electronic circuit to confirm proper functioning of the electronic circuit, and the number of wireless i/o cells on the independent scanning head corresponding in a one to one relationship with the number of wireless i/o cells on the electronic circuit being tested.

2. The non-contact tester for electronic circuits as defined in claim 1, wherein the means for sending and receiving signals via each of the wireless i/o cells is a radio frequency interface.

3. The non-contact tester for electronic circuits as defined in claim 2, wherein the radio frequency interface includes at least one transmitter and at least one receiver.

4. The non-contact tester for electronic circuits as defined in claim 1, wherein the means for sending and receiving signals via each of the wireless i/o cells is an optical interface.

5. The non-contact tester for electronic circuits as defined in claim 4, the optical interface includes at least one light emitter and at least one light receptor.

6. The non-contact tester for electronic circuits as defined in claim 1, wherein the means for sending and receiving signals via each of the wireless i/o cells is a magnetic interface.

7. The non-contact tester for electronic circuits as defined in claim 6, wherein the magnetic interface includes a magnetic detector and a magnetic generator.

* * * * *